(12) United States Patent
Tang

(10) Patent No.: US 12,120,810 B2
(45) Date of Patent: Oct. 15, 2024

(54) CIRCUIT BOARD AND PREPARATION METHOD THEREFOR

(71) Applicant: SHENNAN CIRCUITS CO., LTD., Shenzhen (CN)

(72) Inventor: Changsheng Tang, Shenzhen (CN)

(73) Assignee: SHENNAN CIRCUITS CO., LTD., Shenzhen (CN)

( * ) Notice: Subject to any disclaimer, the term of this patent is extended or adjusted under 35 U.S.C. 154(b) by 120 days.

(21) Appl. No.: 17/965,781

(22) Filed: Oct. 14, 2022

(65) Prior Publication Data

US 2023/0035374 A1 Feb. 2, 2023

Related U.S. Application Data

(63) Continuation of application No. PCT/CN2020/136965, filed on Dec. 16, 2020.

(51) Int. Cl.
*H05K 1/02* (2006.01)
*H05K 1/18* (2006.01)
*H05K 7/20* (2006.01)

(52) U.S. Cl.
CPC ........... *H05K 1/0203* (2013.01); *H05K 1/186* (2013.01); *H05K 7/2039* (2013.01)

(58) Field of Classification Search
CPC ......... H05K 1/02–0212; H05K 1/0263; H05K 1/0298; H05K 1/09; H05K 1/111; H05K 1/113; H05K 1/115; H05K 1/181; H05K 1/186; H05K 1/188; H05K 7/2039; H05K 3/0094; H05K 3/103; H05K 3/107; H05K 3/3436; H05K 3/4007; H05K 3/427; H05K 3/4644; H05K 3/4655; H05K 2201/0355;
(Continued)

(56) References Cited

U.S. PATENT DOCUMENTS 9,674,937 B2 * 6/2017 Park ..................... H05K 1/0298
9,756,730 B2 * 9/2017 Klein ....................... H05K 3/00
(Continued)

FOREIGN PATENT DOCUMENTS

CN 101212862 A 7/2008
CN 110996503 A 4/2020
(Continued)

OTHER PUBLICATIONS

International search report and Written Opinion of the International Search Authority, International Application No. PCT/CN2020/136965, mailed Sep. 15, 2021(10 pages).
(Continued)

*Primary Examiner* — Amir A Jalali

(57) ABSTRACT

Disclosed are a circuit board and its preparation method. The circuit board includes a base layer, a transmission wire layer including multiple conductor tabs, and an insulating and thermally conductive layer including multiple thermally conductive portions. A gap is defined between each adjacent two of the multiple conductor tabs to expose at least a portion of the base layer, and the gap is filled with a corresponding thermally conductive portion. A height of the thermally conductive portion is larger than heights of each adjacent two of the multiple conductor tabs to define a connection groove. The circuit board the disclosure providing enhances heat dissipation performance of circuit boards.

13 Claims, 6 Drawing Sheets

(58) Field of Classification Search
CPC ... H05K 2201/068; H05K 2201/09036; H05K 2201/09063; H05K 2201/09481; H05K 2201/09509; H05K 2201/472; H05K 2023/0191; H05K 2023/025; H01L 21/4853; H01L 21/4857; H01L 21/486; H01L 25/50

See application file for complete search history.

(56) References Cited

U.S. PATENT DOCUMENTS

| | | | | |
|---|---|---|---|---|
| 10,014,246 | B2* | 7/2018 | Kung | H05K 1/181 |
| 2007/0017815 | A1* | 1/2007 | Wang | C25D 5/022 |
| | | | | 257/E23.105 |
| 2009/0038830 | A1* | 2/2009 | Tanaka | H05K 1/0271 |
| | | | | 174/255 |
| 2009/0166076 | A1* | 7/2009 | Song | H05K 1/0346 |
| | | | | 174/262 |
| 2013/0026632 | A1* | 1/2013 | Kikuchi | H01L 21/6835 |
| | | | | 257/E23.01 |
| 2013/0213697 | A1* | 8/2013 | Palaniswamy | H01L 33/486 |
| | | | | 174/254 |
| 2014/0027163 | A1* | 1/2014 | Min | H05K 3/4602 |
| | | | | 174/250 |
| 2015/0257261 | A1 | 9/2015 | Kitagawa | |
| 2015/0270232 | A1* | 9/2015 | Chen | H01L 25/105 |
| | | | | 257/691 |
| 2016/0286660 | A1* | 9/2016 | Gambino | H01L 23/49827 |
| 2019/0157108 | A1* | 5/2019 | Liao | H01L 21/486 |
| 2021/0391168 | A1* | 12/2021 | Chen | H01L 24/20 |
| 2022/0015241 | A1* | 1/2022 | Huang | H01L 23/498 |

FOREIGN PATENT DOCUMENTS

| | | |
|---|---|---|
| CN | 211240270 U | 8/2020 |
| CN | 211267243 U | 8/2020 |
| TW | 201325363 A | 6/2013 |

OTHER PUBLICATIONS

European Search Report, European Application No. 20965471.4, mailed Aug. 7, 2023 (9 pages).

* cited by examiner

CIRCUIT BOARD AND PREPARATION METHOD THEREFOR

CROSS REFERENCE

The present disclosure is a continuation application of International (PCT) Patent Application No. PCT/CN2020/136965, filed on Dec. 16, 2022, the entire contents of which are incorporated herein by reference in its entirety.

TECHNICAL FIELD

The present disclosure relates to circuit technologies, in particular to a circuit board and its preparation method.

BACKGROUND

Circuit board, a kind of significant electronic components, is essential in electronic industry. Regardless the size of an electronic device is large (e.g., computer, communication device, and the system of military weapon) or small (e.g., electric watch and calculator), as long as the electronic device is arranged with integrated circuits and other electronic components, it is necessary to adopt a circuit board for the electronic device in order to achieve the electric connection with each other. At present, the importance of the circuit boards is ever-growing in electronic field.

However, with the development of high-power and high-density electronic devices, the issue of heat dissipation on the circuit boards is increasingly prominent.

SUMMARY OF THE DISCLOSURE

A technical solution adopted in some embodiments of the disclosure is to provide a circuit board including: a base layer; a transmission wire layer including multiple conductor tabs, wherein a gap between each two adjacent conductor tabs to expose at least a portion of the base layer; an insulating and thermally conductive layer including multiple thermally conductive portions, wherein the gap between each two adjacent conductor tabs is filled with a corresponding thermally conductive portion, and a height of the thermally conductive portion is greater than heights of the conductor tabs to define a connection groove.

A second technical solution adopted in some embodiments of the disclosure is to provide an electronic device including a circuit board as described above.

A third technical solution adopted in some embodiments of the disclosure is to provide a method for preparing the circuit board, the method including: providing the base layer; forming the transmission wire layer including multiple conductor tabs, wherein a gap is defined between each two adjacent conductor tabs to expose at least a portion of the base layer; arranging an insulating and thermally conductive layer covering the base layer and the conductor tabs; processing the insulating and thermally conductive layer and the conductor tabs to expose the conductor tabs and to make the height of the insulating and thermally conductive layer, which is filled by a gap between each two adjacent conductor tabs, greater than the height of the conductor tabs so as to define a connection groove.

BRIEF DESCRIPTION OF THE DRAWINGS

In order to more clearly illustrate the technical solutions in the embodiments of the present disclosure, a brief description of the accompanying drawings to be used in the description of the embodiments will be given below. It will be obvious that the accompanying drawings in the following description are only some embodiments of the present disclosure, and that other accompanying drawings may be obtained on the basis of these drawings without any creative effort for those skilled in the art.

DETAILED DESCRIPTION

The technical solutions in the embodiments of the present disclosure will be clearly and completely described below with reference to the specification and drawings in the embodiments of the present disclosure. Obviously, the described embodiments are only a part of the embodiments of the present disclosure, but not all of the embodiments. Based on the embodiments in the present disclosure, all other embodiments obtained by those skilled in the art without creative efforts shall fall within the scope of the present disclosure.

Figure 1:
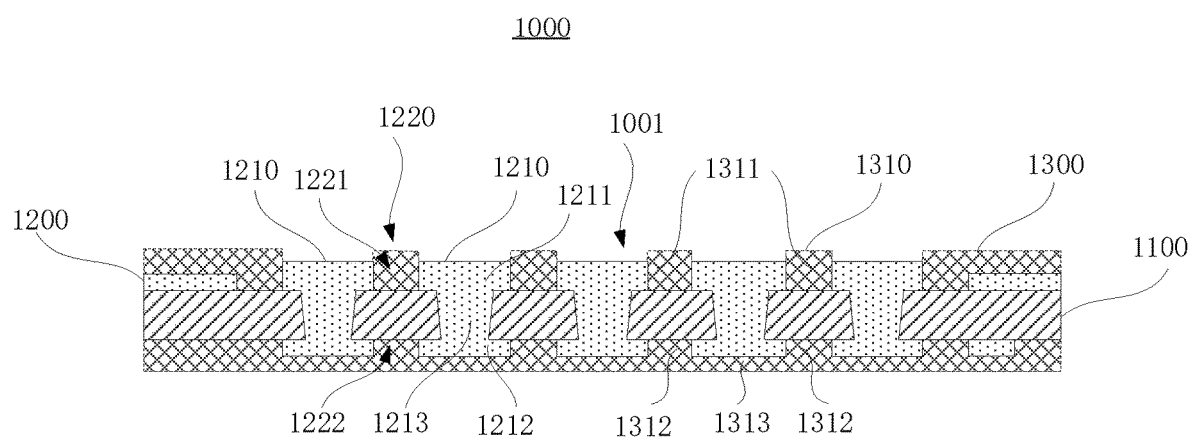
FIG. 1 is a structural cross-sectional schematic view of a circuit board according to an embodiment of the present disclosure.

Referring to FIG. 1, FIG. 1 is a structural cross-sectional schematic view of a circuit board according to an embodiment of the present disclosure. The circuit board 1000 includes a base layer 1100, a transmission wire layer 1200, and an insulating and thermally conductive layer 1300.

The base layer 1100 is configured to support the circuit board 1000, where the base layer 1100 may be of a single-layer structure or a multi-layer structure formed by multiple layers of material layers stacked, which is not limited herein.

The transmission wire layer 1200 is made of a conductive material and designed in patterns, for transmitting electrical signals. The transmission wire layer includes multiple conductor tabs 1210, and the multiple conductor tabs 1210 form a wire pattern. A gap 1220 is defined between each adjacent two of the multiple conductor tabs 1210 to expose at least a portion of the base layer 1100. The transmission wire layer 1200 may be made of any material that can conduct electricity, such as copper, aluminum, iron, alloy, etc.

The insulating and thermally conductive layer 1300 is made of an insulating and thermally conductive material for transmitting heat. Specifically, the insulating and thermally conductive layer 1300 includes multiple thermally conductive portions 1310. The gap 1220 between each two adjacent conductor tabs 1210 is filled with a corresponding thermally conductive portion 1310, and the height of the thermally conductive portion 1310 is greater than the height of the conductor tabs 1210 so that a connection groove 1001 is defined between the two adjacent conductor tabs 1210.

Figure 2:
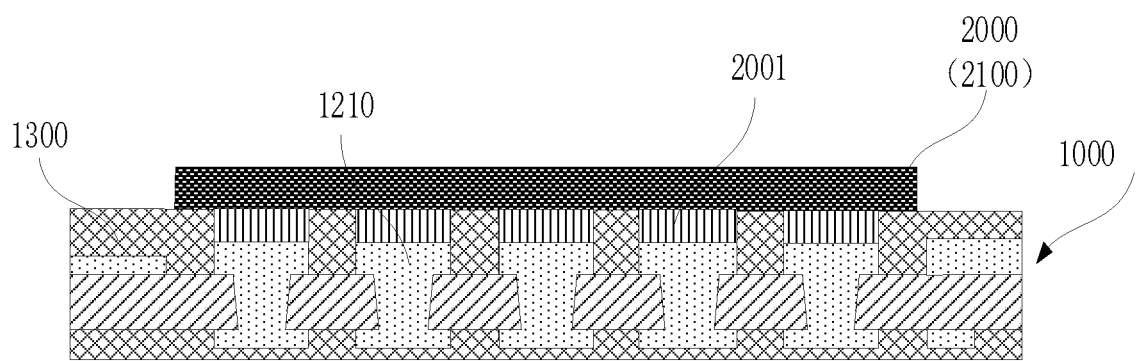
FIG. 2 is a structural cross-sectional schematic view of the circuit board shown in FIG. 1 arranged with a component.

Specifically, as illustrated in FIG. 2, when a component is required to be arranged on the circuit board 1000, a solder 2001 (which includes at least one of tin, gold, copper) is arranged in each connection groove 1001 so that the component 2000 is electrically connected to the conductor tabs 1210 through the solders 2001.

In addition, the gap 1220 between each two adjacent conductor tabs 1210 is filled with a corresponding thermally conductive portion 1310, so that when the component 2000 is arranged on the circuit board 1000 and some of the conductor tabs 1210 are blocked, heat generated by the blocked conductor tabs 1210 may be transferred to other unblocked conductor tabs 1210 through the thermally conductive portions 1310 and thus be heat-dissipated, thereby achieving heat dissipation.

In addition, when the component 2000 is arranged on the circuit board 1000, the distance between the component 2000 and the thermally conductive portions 1310 is close, and the heat generated by the component 2000 may be transferred to the thermally conductive portions 1310 in this case.

In the embodiments, the material of the insulating and thermally conductive layer 1300 may be thermally conductive composite plastic, thermally conductive adhesive, thermally conductive coating, thermally conductive epoxy resin, various types of thermally conductive rubber, elastomer (such as thermal interface elastomer), or composite insulating and thermally conductive polymer material. The composite insulating and thermally conductive polymer material herein may be made of insulating and thermally conductive inorganic particles such as boron nitride, silicon nitride, silicon carbide, etc., and different polymer matrix compounded.

In other embodiments, the insulating and thermally conductive layer 1300 may be made of other materials, as long as the adopted material has good thermal conductivity and insulation properties.

Continuing with FIGS. 1 and 2, in some embodiments, the circuit board 1000 is configured to encapsulate the a chip 2100 (which is a specific example of the component 2000), and when the chip 2100 is arranged on the circuit board 1000, a solder joint position of the chip 2100 is connected to a corresponding conductor tab 1210 through a corresponding solder 2001 arranged on a corresponding connection groove 1001, while a non-solder joint position of the chip 2100 is attached to the insulating and thermally conductive layer 1300.

In addition, the chip 2100 may be either a bare chip or a packaged chip. In this case, the heat generated by the chip 2100 may be directly dissipated through the insulating and thermally conductive layer 1300 to further improve the heat dissipation performance.

The solder joint position of the chip 2100 is connected to the conductor tab 1210 through the solder 2001, thereby achieving the electrical signal transmission between the chip 2100 and the conductor tab 1210.

In the related art, there are two options for heat dissipation after chip packaging, one is to increase the layout area of the circuit board and reduce the wiring density of the circuit board, and the other is to arrange heat dissipation components, such as placing a graphene sheet or adopting a copper tube for heat dissipation, etc. The first option is not conducive to high-density wiring of the circuit board and not conducive to the development of miniaturization of the circuit board. The second option leads to increased diversity of devices, increasing the difficulty of assembly, which is also not conducive to the development of miniaturization of the circuit board.

As a comparison, in an application scenario of the present disclosure, the heat generated by the chip 2100 is directly transferred to the insulating and thermally conductive layer 1300, without requirement of increasing the layout area of the circuit board 1000 or additional heat dissipation components, thereby solving the problems existing in the related art.

In other words, when the circuit board 1000 encapsulates the chip 2100, the insulating and thermally conductive layer 1300 can dissipate heat for both the transmission wire layer 1200 and the chip 2100, which may further improve the thermal performance.

Continuing to refer to FIG. 1, the conductor tab 1210 penetrates the base layer 1100, which allows the heat on the conductor tab 1210 to be transferred in a height (vertical) direction of the circuit board 1000 for accelerating the heat dissipation. In other embodiments, the conductor tabs 1210 may be arranged on only one side of the base layer 1100, without limitation herein.

Continuing to refer to FIG. 1, each conductor tab 1210 includes a first portion 1211, a second portion 1212, and a connection portion 1213. The first portion 1211 extends from a first side of the base layer 1100 and the second portion 1212 extends from a second side of the base layer 1100 opposite to the first side. That is, the first portion 1211 and the second portion 1212 are arranged on the back-to-back sides of the base layer 1100. The connection portion 1213 is connected to the first portion 1211 and the second portion 1212 and penetrates the base layer 1100. A first gap 1221 is defined between each two adjacent first portions 1211 of each two adjacent conductor tabs 1210, and a second gap 1222 is defined between each two adjacent second portions 1212 of each two adjacent conductor tabs 1210.

Specifically, due to the above arrangement of the first portion 1211, the second portion 1212, and the connection portion 1213, the circuit board 1000 is a double-sided circuit board. That is, both sides of the circuit board 1000 disposed back from each other can be configured to transmit electrical signals.

In other embodiments, each conductor tab 1210 may include only the first portion 1211 or the second portion 1212, where the circuit board 1000 is a single-sided circuit board. In further other embodiments, each conductor tab 1210 may include one of the first portion 1211, the second portion 1212, and the connection portion 1213.

Continuing to refer to FIG. 1, each thermally conductive portion 1310 includes a first sub thermally conductive portion 1311 and a second sub thermally conductive portion 1312. The first sub thermally conductive portion 1311 fills the first gap 1221 and the second sub thermally conductive portion 1312 fills the second gap 1222, and the height of the first sub thermally conductive portion 1311 is greater than the height of the first portion 1211 to define the connection groove 1001.

Specifically, filling the first sub thermally conductive portion 1311 in the first gap 1221 and filling the second sub thermally conductive portion 1312 in the second gap 1222 improve the double-sided thermal performance of the circuit board 1000.

In other embodiments, the second gap 1222 may be unfilled with the second sub thermally conductive portion 1312, and the second gap 1222 is not filled with any substance.

Continuing to refer to FIG. 1, the insulating and thermally conductive layer 1300 further includes a thermally conductive connection portion 1313 connecting the second sub thermally conductive portions 1312 of the multiple thermally conductive portions 1310.

Specifically, the thermally conductive connection portion 1313 allows that the transmission wire layer 1200 on a side of the circuit board 1000 is completely covered by the insulating and thermally conductive layer 1300 so that other material layers may be covered on the circuit board 1000.

In other embodiments, the height of each second sub thermally conductive portion 1312 may be greater than the height of a corresponding second portion 1212 to define the connection groove 1001. In this case, both sides of the circuit board 1000 disposed back from each other can be arranged with components 2000.

Figure 3:
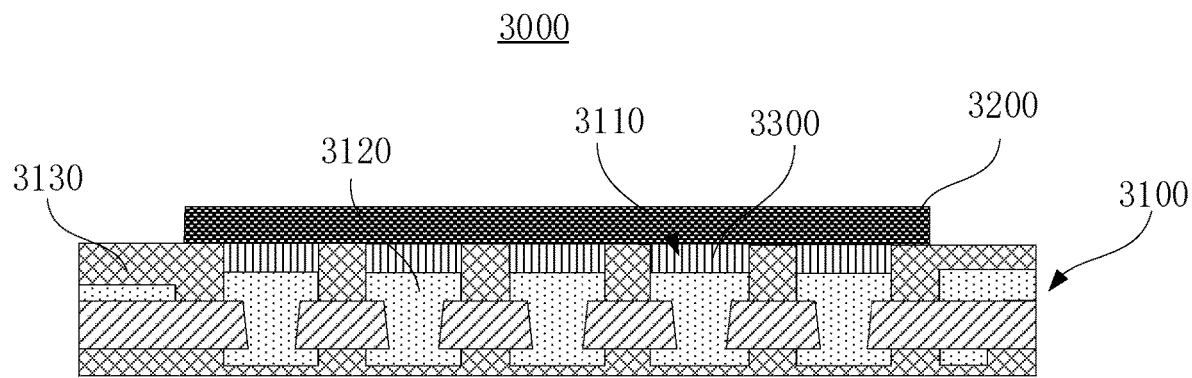
FIG. 3 is a structural cross-sectional schematic view of an electronic device according to an embodiment of the present disclosure.

Referring to FIG. 3, FIG. 3 is a structural cross-sectional schematic view of an electronic device according to an embodiment of the present disclosure. The electronic device 3000 includes a circuit board 3100 and a chip 3200.

The structure of the circuit board 3100 is the same as the structure of the circuit board 1000 in either of the above embodiments, and reference thereto may be made in the above embodiments, which will not be repeated herein.

A solder joint position of the chip 3200 is connected to the circuit board 3100 through a connection groove 3110 with a solder 3300 and connected to a corresponding conductor tab 3120. A non-solder joint position of the chip 3200 is connected to an insulating and thermally conductive layer 3130.

The chip 3200 herein may be a bare chip or a packaged chip.

In the embodiments, the insulating and thermally conductive layer 3130 transmits the heat generated by the conductor tab 3120 and also transmits the heat generated by the chip 3200, so that the heat dissipation of the chip 3200 can be achieved without arranging additional heat dissipation elements and expanding the layout area of the circuit board 3100.

In other embodiments, the circuit board 3100 may be arranged without the chip 3200. Further, the circuit board 3100 may be arranged not with the chip 3200 but with other components, without limitation herein.

Figure 4:
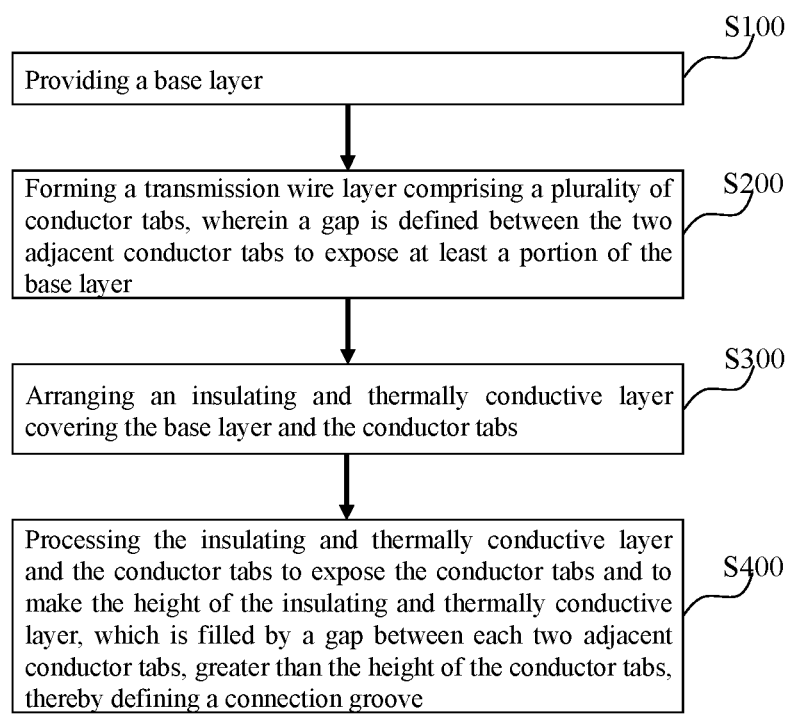
FIG. 4 is a flow chart of a method for preparing a circuit board according to an embodiment of the present disclosure.
Figure 5:
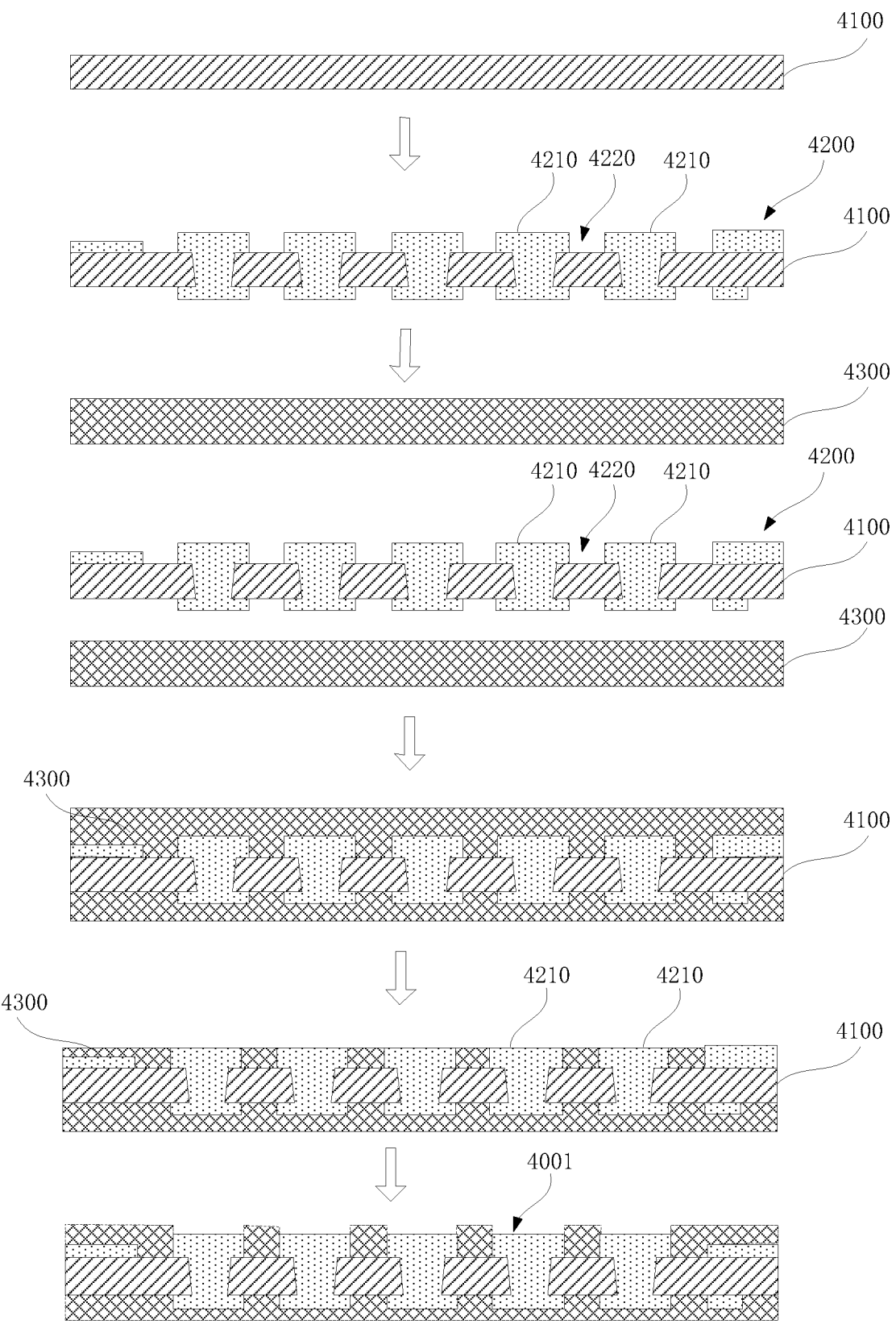
FIG. 5 is a processing schematic view of FIG. 4.
Figure 6:
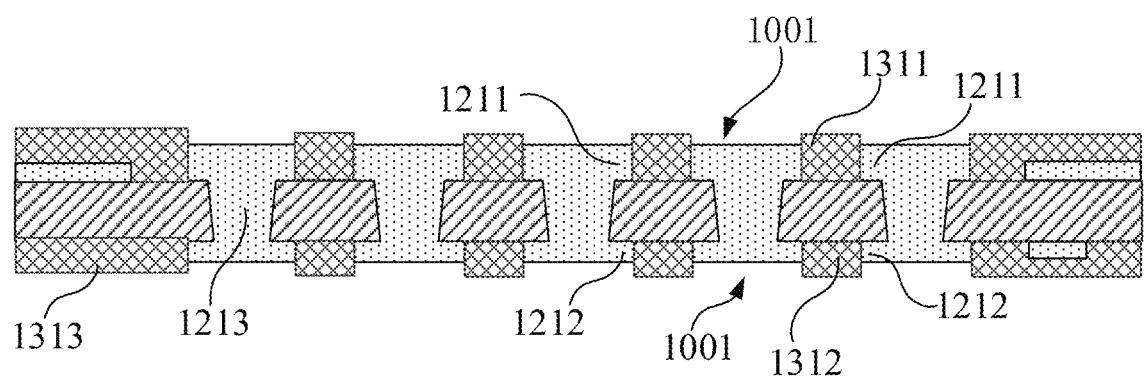
FIG. 6 is a structural cross-sectional schematic view of the circuit board according to an embodiment of the present disclosure.

Referring to FIGS. 4 and 5, FIG. 4 is a flow chart of a method for preparing a circuit board according to an embodiment of the present disclosure. The method includes operations at blocks illustrated herein.

At block S100: providing a base layer 4100.

In S100, the base layer 4100 may be of either a single-layer structure or a multi-layer structure.

At block S200: forming a transmission wire layer 4200, wherein the transmission wire layer 4200 includes multiple conductor tabs 4210; defining a gap between each two adjacent conductor tabs 4210 to expose at least a portion of the base layer 4100.

Specifically, the conductor tabs 4210 may be arranged on only one side of the base layer 4100. Alternatively, the conductor tabs 4210 may be arranged on both sides of the base layer 4100, and in this case, the conductor tabs 4210 may penetrate the base layer 4100 as shown in FIG. 5. The following will be described with the conductor tabs 4210 penetrating the base layer 4100 as an example.

At block S300: Arranging an insulating and thermally conductive layer 4300 covering the base layer 4100 and the conductor tabs 4210.

Specifically, in the embodiments, the insulating and thermally conductive layer 4300 is covered on the base layer 4100 and the conductor tabs 4210 using a lamination technique.

In some embodiments, in order to achieve the insulating properties of the insulating and thermally conductive layer 4300 as well as reduce external impurities from mixing into the insulating and thermally conductive layer 4300 during the lamination process. Before the lamination is performed, a substrate layer (not shown, the substrate layer may be specifically a release film or copper foil) is arranged on a side of the insulating and thermally conductive layer 4300 away from the base layer 4100. After laminating the insulating and thermally conductive layer 4300 on the base layer 4100 and the transmission wire layer 4200, the substrate layer is removed.

In additions, other processing technologies may be applied to arrange the insulating and thermally conductive layer 4300, such as vapor deposition process, vacuum distillation, ink jet printing, etc., without limitation herein.

At block S400: processing the insulating and thermally conductive layer 4300 and the conductor tabs 4210 to expose the conductor tabs 4210 and make the height of the insulating and thermally conductive layer 4300, which is filled by a gap 4220 between each two adjacent conductor tabs 4210, greater than the height of the conductor tabs 4210, thereby defining a connection groove 4001.

In some embodiments, as illustrated in FIG. 5, the step S400 specifically includes: grinding the insulating and thermally conductive layer 4300 until the conductor tabs 4210 are exposed; and processing the conductor tabs 4210 to reduce their heights.

Specifically, the conductor tabs 4210 may be processed by the following methods: chemical etching, UV laser drilling ablation, UV laser milling, and $CO_2$ laser drilling ablation, etc.

In other embodiments, after arranging the insulating and thermally conductive layer 4300 covering the base layer 4100 and the conductor tabs 4210, a part of the conductor tabs 4210 and a part of the insulating and thermally conductive layer 4300 covering on the conductor tabs 4210 are processed directly to remove the part of the insulating and thermally conductive layer 4300 on the conductor tabs 4210 by milling and reduce the height of the conductor tabs 4210.

The circuit board produced by the preparation method in the present disclosure is the same structure as the circuit board in either of the above embodiments, and the detailed structure of the circuit board can be found in the above embodiments and will not be repeated here.

Disclosed are a circuit board and its preparation method. The circuit board includes a base layer, a transmission wire layer including multiple conductor tabs, and an insulating and thermally conductive layer including multiple thermally conductive portions. A gap is defined between each adjacent two of the multiple conductor tabs to expose at least a portion of the base layer, and the gap is filled with a corresponding thermally conductive portion. A height of the thermally conductive portion is larger than heights of each adjacent two of the multiple conductor tabs to define a connection groove. The circuit board the disclosure providing enhances heat dissipation performance of circuit boards.

The above is only some embodiments of the present disclosure, not to limit the scope of the present disclosure. Any equivalent structure or equivalent process transformation using the contents and the accompanying drawings of the present disclosure, or directly or indirectly applied in other related technical fields, are included in the scope of the present disclosure.

What is claimed is:

1. A circuit board, comprising:
    a base layer;
    a transmission wire layer, comprising a plurality of conductor tabs; wherein a gap is defined between each adjacent two of the plurality of conductor tabs to expose at least a portion of the base layer; and
    an insulating and thermally conductive layer, comprising a plurality of thermally conductive portions; wherein each gap is filled with a corresponding insulating and thermally conductive portion, and a height of the corresponding insulating and thermally conductive portion is greater than heights of the each adjacent two of the plurality of conductor tabs to define a connection groove, wherein thermally conductive portion comprises: a first sub thermally conductive portion, wherein the first gap is filled with the first sub thermally conductive portion; and a second sub thermally conductive portion, wherein the second gap is filled with the second sub thermally conductive portion, wherein a height of the first sub thermally conductive portion is greater than heights of each two adjacent corresponding first portions to define a part of a corresponding connection groove on a first side of the connection portion while a height of the second sub thermally conductive portion is greater than heights of each two adjacent corresponding second portions to define a part of another corresponding connection groove on a second side of the connection portion.

2. The circuit board according to claim 1, wherein the circuit board comprises a chip and the connection groove is configured to arrange a solder so that a solder joint position of the chip is connected to a corresponding conductor tab by the solder arranged in the connection groove, while a non-solder joint position of the chip is arranged to the insulating and thermally conductive layer.

3. The circuit board according to claim 1, wherein the conductor tabs penetrate the base layer.

4. The circuit board according to claim 3, wherein each conductor tab comprises:
- a first portion, extending from a first side of the base layer, wherein a first gap is defined between the first portions of each two adjacent conductor tabs;
- a second portion, extending from a second side of the base layer, wherein a second gap is defined between the second portions of each two adjacent conductor tabs; and
- a connection portion, connected to the first portion and the second portion, penetrating the base layer.

5. The circuit board according to claim 3, wherein each conductor tab comprises:
- a first portion and a connection portion, wherein the first portion extends from a first side of the base layer; wherein the connection portion is connected to the first portion and penetrates the base layer; wherein a first gap is defined between the first portions of each two adjacent conductor tabs; or
- a second portion and a connection portion, wherein the second portion extends from a second side of the base layer opposite to the first side; wherein the connection portion is connected to the second portion and penetrates the base layer; wherein a second gap is defined between the second portions of each two adjacent conductor tabs.

6. The circuit board according to claim 5, wherein each thermally conductive portion comprises:
- a first sub thermally conductive portion, wherein the first gap is filled with the first sub thermally conductive portion; wherein a height of the first sub thermally conductive portion is greater than heights of each two adjacent corresponding first portions to define a corresponding connection groove; wherein the insulating and thermally conductive layer comprises a thermally conductive connection portion connected to the first sub thermally conductive portions; or
- a second sub thermally conductive portion, wherein the second gap is filled with the second sub thermally conductive portion; wherein a height of the second sub thermally conductive portion is greater than heights of each two adjacent corresponding second portions to define a corresponding connection groove; wherein the insulating and thermally conductive layer comprises a thermally conductive connection portion connected to the second sub thermally conductive portions.

7. An electronic device, comprising a circuit board; wherein the circuit board comprises:
a base layer;
a transmission wire layer, comprising a plurality of conductor tabs; wherein a gap is defined between each adjacent two of the plurality of conductor tabs to expose at least a portion of the base layer; and
an insulating and thermally conductive layer, comprising a plurality of insulating and thermally conductive portions; wherein each gap is filled with a corresponding insulating and thermally conductive portion, and a height of the corresponding thermally conductive portion is greater than heights of the each adjacent two of the plurality of conductor tabs to define a connection groove, wherein thermally conductive portion comprises: a first sub thermally conductive portion, wherein the first gap is filled with the first sub thermally conductive portion; and a second sub thermally conductive portion, wherein the second gap is filled with the second sub thermally conductive portion, wherein a height of the first sub thermally conductive portion is greater than heights of each two adjacent corresponding first portions to define a part of a corresponding connection groove on a first side of the connection portion while a height of the second sub thermally conductive portion is greater than heights of each two adjacent corresponding second portions to define a part of another corresponding connection groove on a second side of the connection portion.

8. The circuit board according to claim 7, wherein the circuit board comprises a chip and the connection groove is configured to arrange a solder so that a solder joint position of the chip is connected to a corresponding conductor tab by the solder arranged in the connection groove, while a non-solder joint position of the chip is arranged to the insulating and thermally conductive layer.

9. The electronic device according to claim 7, wherein the conductor tabs penetrate the base layer.

10. The electronic device according to claim 9, wherein each conductor tab comprises:
- a first portion, extending from a first side of the base layer, wherein a first gap is defined between the first portions of each two adjacent conductor tabs;
- a second portion, extending from a second side of the base layer, wherein a second gap is defined between the second portions of each two adjacent conductor tabs; and
- a connection portion, connected to the first portion and the second portion, penetrating the base layer.

11. The electronic device according to claim 9, wherein each conductor tab comprises:
- a first portion and a connection portion, wherein the first portion extends from a first side of the base layer; wherein the connection portion is connected to the first portion and penetrates the base layer; wherein a first gap is defined between the first portions of each two adjacent conductor tabs; or a second portion and a connection portion, wherein the second portion extends from a second side of the base layer opposite to the first side; wherein the connection portion is connected to the second portion and penetrates the base layer; wherein a second gap is defined between the second portions of each two adjacent conductor tabs.

12. The electronic device according to claim 11, wherein each thermally conductive portion comprises:
a first sub thermally conductive portion, wherein the first gap is filled with the first sub thermally conductive portion; wherein a height of the first sub thermally conductive portion is greater than heights of each two adjacent corresponding first portions to define a corresponding connection groove; wherein the insulating and thermally conductive layer comprises a thermally conductive connection portion connected to the first sub thermally conductive portions; or
a second sub thermally conductive portion, wherein the second gap is filled with the second sub thermally conductive portion; wherein a height of the second sub thermally conductive portion is greater than heights of each two adjacent corresponding second portions to define a corresponding connection groove; wherein the insulating and thermally conductive layer comprises a thermally conductive connection portion connected to the second sub thermally conductive portions.

13. The electronic device according to claim 7, wherein the electronic device comprises a chip,
wherein a solder joint position of the chip is connected to a corresponding conductor tab through the connection groove with a solder while a non-solder joint position of the chip is arranged to the insulating and thermally conductive layer.

* * * * *